United States Patent
Cea et al.

(10) Patent No.: US 8,847,281 B2
(45) Date of Patent: Sep. 30, 2014

(54) HIGH MOBILITY STRAINED CHANNELS FOR FIN-BASED TRANSISTORS

(75) Inventors: Stephen M. Cea, Hillsboro, OR (US); Anand S. Murthy, Portland, OR (US); Glenn A. Glass, Beaverton, OR (US); Daniel B. Aubertine, North Plains, OR (US); Tahir Ghani, Portland, OR (US); Jack T. Kavalieros, Portland, OR (US); Roza Kotlyar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 109 days.

(21) Appl. No.: 13/560,474

(22) Filed: Jul. 27, 2012

(65) Prior Publication Data

US 2014/0027816 A1    Jan. 30, 2014

(51) Int. Cl.
*H01L 29/165*    (2006.01)

(52) U.S. Cl.
USPC ............. 257/192; 257/E29.082; 257/E29.085

(58) Field of Classification Search
CPC .................................................... H01L 21/845
USPC ................... 257/E29.056, E29.193, E29.082, 257/E29.085; 438/142, 293
See application file for complete search history.

(56) References Cited

U.S. PATENT DOCUMENTS

| | | | | |
|---|---|---|---|---|
| 5,516,724 | A * | 5/1996 | Ast et al. | 438/541 |
| 7,198,990 | B2 * | 4/2007 | Joshi et al. | 438/142 |
| 7,241,653 | B2 * | 7/2007 | Hareland et al. | 438/199 |
| 7,297,990 | B1 | 11/2007 | Berger et al. | |
| 7,348,284 | B2 * | 3/2008 | Doyle et al. | 438/142 |
| 7,781,771 | B2 | 8/2010 | Lindert et al. | |
| 7,960,794 | B2 * | 6/2011 | Doyle et al. | 257/369 |
| 2005/0224800 | A1 * | 10/2005 | Lindert et al. | 257/66 |
| 2006/0033095 | A1 * | 2/2006 | Doyle et al. | 257/19 |
| 2006/0076625 | A1 * | 4/2006 | Lee et al. | 257/353 |
| 2007/0111406 | A1 * | 5/2007 | Joshi et al. | 438/142 |
| 2007/0241399 | A1 * | 10/2007 | Irisawa et al. | 257/347 |
| 2010/0163926 | A1 * | 7/2010 | Hudait et al. | 257/190 |

(Continued)

OTHER PUBLICATIONS

Tejas Krishnamohan, Zoran Krivokapic, Ken Uchida, Yoshio Nishi, Fellow, IEEE, and Krishna C. Saraswat, High-Mobility Ultrathin Strained Ge MOSFETs on Bulk and SOI With Low Band-to-Band Tunneling Leakage: Experiments, May 2006, IEEE,IEEE Transactions on Electron Devices, vol. 53, No. 5, May 2006, pp. 990-999.*

(Continued)

*Primary Examiner* — William F Kraig
*Assistant Examiner* — Pavel Ivanov
(74) *Attorney, Agent, or Firm* — Finch & Maloney PLLC

(57) ABSTRACT

Techniques are disclosed for incorporating high mobility strained channels into fin-based transistors (e.g., FinFETs such as double-gate, trigate, etc), wherein a stress material is cladded onto the channel area of the fin. In one example embodiment, silicon germanium (SiGe) is cladded onto silicon fins to provide a desired stress, although other fin and cladding materials can be used. The techniques are compatible with typical process flows, and the cladding deposition can occur at a plurality of locations within the process flow. In some cases, the built-in stress from the cladding layer may be enhanced with a source/drain stressor that compresses both the fin and cladding layers in the channel. In some cases, an optional capping layer can be provided to improve the gate dielectric/semiconductor interface. In one such embodiment, silicon is provided over a SiGe cladding layer to improve the gate dielectric/semiconductor interface.

22 Claims, 8 Drawing Sheets

(56) References Cited

U.S. PATENT DOCUMENTS

| | | | |
|---|---|---|---|
| 2011/0024794 A1* | 2/2011 | Ko et al. | 257/190 |
| 2011/0147811 A1* | 6/2011 | Kavalieros et al. | 257/288 |
| 2011/0180851 A1 | 7/2011 | Doyle et al. | |
| 2011/0241123 A1 | 10/2011 | Li | |
| 2011/0303983 A1 | 12/2011 | Basker et al. | |
| 2012/0025312 A1 | 2/2012 | Scheiper et al. | |
| 2012/0319211 A1* | 12/2012 | van Dal et al. | 257/401 |
| 2013/0270638 A1* | 10/2013 | Adam et al. | 257/347 |

OTHER PUBLICATIONS

Ramesh, et al., "High 5.2 peak-to-valley current ratio in Si/SiGe resonant interband tunnel diodes grown by chemical vapor deposition", Applied Physics Letters, published Feb. 28, 2012, vol. 100, Issue 9, 5 Pages. Available at: http://dx.doi.org/10.1063/1.3684834.
International Search Report and Written Opinion received for Patent Application No. PCT/US2013/045440, mailed on Sep. 25, 2013, 9 pages.

\* cited by examiner

HIGH MOBILITY STRAINED CHANNELS FOR FIN-BASED TRANSISTORS

BACKGROUND

A FinFET is a transistor built around a thin strip of semiconductor material (generally referred to as the fin). The transistor includes the standard field effect transistor (FET) nodes, including a gate, a gate dielectric, a source region, and a drain region. The conductive channel of the device resides on the outer sides of the fin beneath the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a trigate FinFET. Other types of FinFET configurations are also available, such as so-called double-gate FinFETs, in which the conductive channel principally resides only along the two sidewalls of the fin (and not along the top of the fin). There are a number of non-trivial issues associated with fabricating such fin-based transistors.

DETAILED DESCRIPTION

Figure 1:
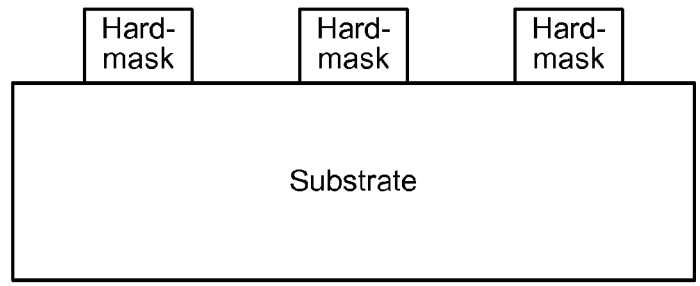
FIGS. 1 through 7 and 9 through 12 illustrate a method for forming a fin-based transistor structure, in accordance with an embodiment of the present invention.

Techniques are disclosed for incorporating high mobility strained channels into fin-based transistors (e.g., FinFETs such as double-gate, trigate, etc), wherein a stress material is cladded onto the channel area of the fin. In one example embodiment, silicon germanium (SiGe) is cladded onto silicon fins to provide a desired stress, although other fin and cladding materials can be used. The techniques are compatible with typical process flows, and the cladding deposition can occur at a plurality of locations within the process flow. In some cases, the built-in stress from the cladding layer may be enhanced with a source/drain stressor that compresses both the fin and cladding layers in the channel. In some cases, an optional capping layer can be provided to improve the gate dielectric/semiconductor interface. In one such embodiment, silicon is provided over a SiGe cladding layer to improve the gate dielectric/semiconductor interface. Numerous variations and embodiments will be apparent in light of this disclosure.

General Overview

As previously stated, there are a number of non-trivial issues associated with fabricating FinFETs. For instance, high mobility PMOS channels have been engineered using source/drain SiGe stressors for many generations now. However, the source/drain SiGe stressors are dependent on pitch so for smaller gate pitches the stress decreases for the same germanium concentration in the source/drain stressors. Such a reduction in stress effectively limits the ability to further improve channel mobility as well as further limits continued scaling to smaller pitches.

Thus, and in accordance with an embodiment of the present invention, stress is built-into a silicon channel by depositing a SiGe cladding layer thereon. The SiGe cladding process can occur at various times in the flow including after trench etch during fin formation, after shallow trench isolation (STI) material recess to expose the fins, and after removal of the sacrificial gate stack (assuming a replacement metal gate flow). In this sense, the cladding deposition process and the overall process flow are highly compatible. Both selective and non-selective process routes can be used in forming the cladding layer. In some embodiments, the built-in stress from a deposited SiGe cladding layer on a silicon fin can be enhanced with a SiGe source/drain stressor that compresses both the silicon fin and SiGe cladding layers in the channel area. In some such embodiments, the SiGe cladding layer can have germanium concentration ranging from, for example, 10-70%. In some such embodiments, an optional cap of, for instance, either selective or non-selective silicon can be provided over the SiGe cladding layer to improve the interface between the semiconductor channel and the gate dielectric layer (which may be, for instance, a high-k dielectric).

Once the fins are formed and the SiGe cladding layer has been provided in the channel area (which may occur at one or more times during the process), a FinFET transistor process flow can be executed to fabricate, for instance, high-k metal gate transistors. Any number of transistor types and/or formation process flows may benefit from the channel strain techniques provided herein, such as n-channel metal oxide semiconductor (NMOS) transistors, p-channel MOS (PMOS) transistors, or both PMOS and NMOS transistors within the same flow, whether configured with thin or thick gates, and with any number of geometries. As will be appreciated, compressively strained SiGe is particularly attractive for PMOS devices, whether alone or in conjunction with NMOS devices such as silicon NMOS devices. For instance, the techniques provided herein can be used in fabricating SiGe PMOS fins and silicon NMOS fins together. Likewise, numerous material systems can benefit from the techniques described herein, as will be apparent in light of this disclosure, and the claimed invention is not intended to be limited to any particular one or set. Rather, the techniques can be employed wherever built-in channel strain is helpful.

The techniques can be embodied, for example, in any number of integrated circuits, such memories and processors and other such devices that are fabricated with transistors and other active junction semiconductor devices, as well as in methodologies suitable for practice at fabs where integrated circuits are made. Use of the techniques described herein manifest in a structural way. For instance, a cross-section image of transistors formed in accordance with an embodiment, such as an image provided with a transmission electron microscope (TEM), demonstrate a cladding layer on the channel portion of the fin, as compared to a conventional fin-based transistors.

Variations on incorporating high mobility strained SiGe channels onto silicon fins will be apparent in light of this disclosure. For instance, another embodiment may incorporate high mobility strained germanium channels onto silicon fins, and another embodiment may incorporate high mobility strained germanium channels onto SiGe fins. Further note that the fins may be native to the substrate (and therefore the same material as the substrate) or may be formed on the substrate. One such example embodiment incorporates high mobility strained germanium channels onto SiGe fins formed on a silicon substrate. In further embodiments, note that the cladding may be on the top and two sides of the fin (tri-gate FinFET) or only on the two sides of the fin (double-gate FinFET).

Fin Structure

FIGS. 1 through 7 and 9 through 12 illustrate a method for forming a fin-based transistor structure in accordance with an embodiment of the present invention. As will be appreciated, each of the views shown in FIGS. 1 through 7 is a cross-sectional side view taking across the channel region and perpendicular to the fins, and each of the views shown in FIGS. 9 through 12 is a cross-sectional side view taking across the channel region and parallel to the fins. FIGS. 8a-d demonstrate an alternative methodology in accordance with another embodiment, and will be discussed in turn.

As can be seen in FIG. 1, a substrate is provided. Any number of suitable substrates can be used here, including bulk substrates, semiconductors on insulator substrates (XOI, where X is a semiconductor material such as Si, Ge or Ge-enriched Si), and multi-layered structures, and particularly those substrates upon which fins are formed prior to a subsequent gate patterning process. In one specific example case, the substrate is a bulk silicon substrate. In another example case, the substrate is a silicon on insulator (SOI) substrate. In another example case, the substrate is a bulk SiGe substrate. In another example case, the substrate is a multilayered substrate having a SiGe layer on a silicon layer. In another example case, the substrate is a SiGe on insulator (SiGeOI) substrate. Any number of configurations can be used, as will be apparent.

FIG. 1 further illustrates a patterned hardmask on the substrate, which can be carried out using standard photolithography, including deposition of hardmask materials (e.g., such as silicon dioxide, silicon nitride, and/or other suitable hardmask materials), patterning resist on a portion of the hardmask that will remain temporarily to protect an underlying region of the substrate that will become the fins, etching to remove the unmasked (no resist) portions of the hardmask (e.g., using a dry etch, or other suitable hardmask removal process), and then stripping the patterned resist material, thereby leaving the patterned hardmask as shown. Alternatively, the hardmask can be selectively deposited in an additive process that doesn't require etching.

In one example embodiment, the resulting hardmask is a standard two-layer hardmask configured with a bottom layer of oxide and top layer of silicon nitride, and includes three locations, but in other embodiments, the hardmask may be configured differently, depending on the particular active device being fabricated and the number of fins to be formed. In one specific example embodiment having a silicon substrate, the hardmask is implemented with a bottom layer of native oxide (oxidation of silicon substrate) and top layer of silicon nitride (SiN). Any number of hardmask configurations can be used, as will be apparent.

Figure 2:
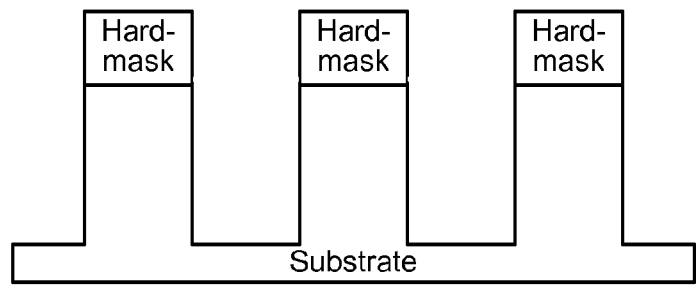

As can be seen in FIG. 2, shallow trenches are etched into the substrate to form a plurality of fins. The shallow trench etch can be accomplished with standard photolithography include wet or dry etching, or a combination of etches if so desired. The geometry of the trenches (width, depth, shape, etc) can vary from one embodiment to the next as will be appreciated, and the claimed invention is not intended to be limited to any particular trench geometry. In one specific example embodiment having a silicon substrate and a two-layer hardmask implemented with a bottom oxide layer and a top SiN layer, a dry etch is used to form the trenches that are about 100 Å to 5000 Å below the top surface of the substrate. Any number of trench configurations can be used, as will be apparent. After the fins are formed, the hardmask can be removed, as shown in the example embodiment of FIG. 3. Such complete removal of the hardmask allows for the top of the fin to be cladded so as to form tri-gate structures. In other embodiments, however, note that some of the hardmask may be left behind, so that only sides of the fin are cladded (and not the top) so as to provide a double-gate structure. While the illustrated embodiment shows fins as having a width that does not vary with distance from the substrate, the fin may be narrower at the top than the bottom in another embodiment, wider at the top than the bottom in another embodiment, or having any other width variations and degrees of uniformity (or non-uniformity). Further note that the width variation may, in some embodiments, be symmetrical or asymmetrical. Also, while the fins are illustrated as all having the same width, some fins may be wider and/or otherwise shaped differently than others. For example, in an embodiment, fins to be used in the creation of NMOS transistors may be narrower than fins to be used in the creation of PMOS transistors. Other arrangements are possible, as will be appreciated.

Figure 4:
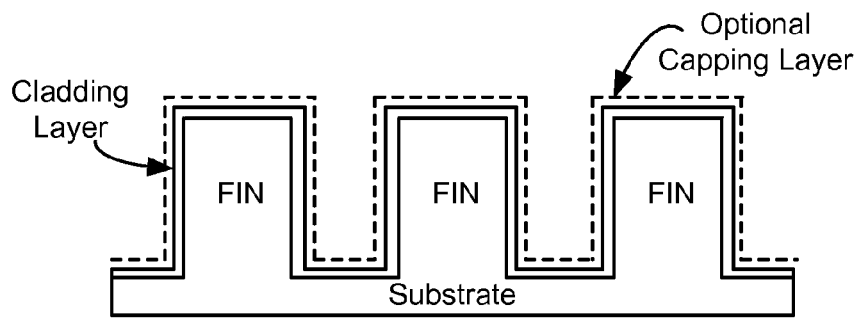

As can be seen in the example embodiment of FIG. 4, a cladding layer can then be deposited. In this example case, the cladding deposition is non-selective, in that the entire fin surface area is cladded. In some such non-selective cases where there are both PMOS and NMOS fin-based devices, note that it may be desirable, for instance, to etch off any cladding material from NMOS regions. In some embodiments, the cladding layer can be an epitaxial growth of, for example, silicon germanium (SiGe) alloy of arbitrary composition, suitable for a given application or otherwise desired. In another example embodiment, the cladding layer can be an epitaxial growth of germanium. Any suitable epitaxial deposition techniques such as chemical vapor deposition (CVD), rapid thermal CVD (RT-CVD), gas-source molecular beam epitaxy (GS-MBE), etc can be used to provide the cladding material, as will be appreciated in light of this disclosure.

Note that in some embodiments, the cladding layer is free of crystalline defects such as stacking faults and dislocations. While such stacking faults and dislocations may be present at some acceptably low level, their presence above such a threshold may adversely impact the desired channel strain. In this sense, there is a trade between the germanium percentage and thickness of the cladding layer. This is because the overall dislocation free (strained) thickness is generally a product of composition and layer thickness. For example, given a SiGe cladding layer of 50% germanium, a cladding layer thickness of about 100 angstroms (Å) or less would be fully strained, but a SiGe cladding layer at 75% germanium might be limited to a cladding layer thickness of only about 50 Å or less before onset of defective deposition. Thus, in one specific embodiment, the cladding layer is a SiGe alloy free of crystalline defects such as stacking faults and dislocations. As used herein, and in accordance with some such embodiments, 'free of crystalline defects' means that the defects in the cladding layer are less than 0.05% by volume or otherwise do not lead to unacceptable shorting/open (yield loss) and performance loss, as measured by a given standard. Further note that the cladding layer critical thickness can vary greatly and these examples are not intended to limit the claimed invention to a particular range of layer thicknesses.

As can be further seen in FIG. 4, an optional capping layer can be deposited to protect the cladding layer and/or to improve the gate dielectric/semiconductor interface. In one such embodiment, a silicon capping layer is deposited over a SiGe cladding layer. The deposition techniques for providing the optional capping layer can be, for example, the same as those used in provisioning the cladding layer (e.g., CVD, RT-CVD, GS-MBE, etc). The thickness of the capping layer can also vary from one embodiment to the next. In some cases, the capping layer has a thickness in the range of 10 to 50 Å. In still other cases, the capping layer has a thickness that is about 10% to 50% of the cladding layer thickness.

After provisioning of the cladding layer and optional capping layer, the flow may continue in a conventional manner, in some embodiments, or in custom or proprietary manner in still other embodiments. As can be seen, FIGS. 5 through 12 assume that the optional capping layer was not provided. However, configurations that include the capping layer will be readily apparent in light of this disclosure.

Figure 5:
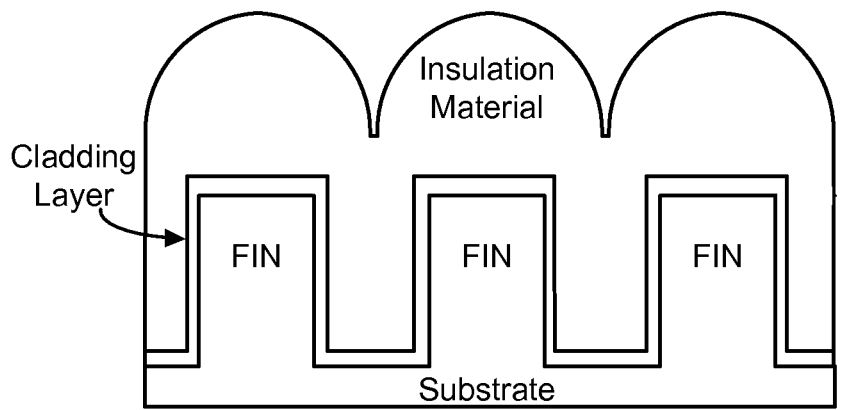

As can be seen in the example embodiment of FIG. 5, the trenches are subsequently filled with an oxide material (or other suitable insulator material), using any number of standard deposition processes. In one specific example embodiment having a silicon substrate and a SiGe cladding layer, the deposited insulator material is silicon dioxide ($SiO_2$) but any number suitable isolation oxides/insulator materials can be used to form the shallow trench isolation (STI) structures here. In general, the deposited or otherwise grown insulator material for filling the trenches can be selected, for example, based on compatibility with the native oxide of the cladding and/or optional capping material. Note that the gate trench may be circular or polygonal in nature, and any reference to trench 'sides' is intended to refer to any such configurations, and should not be interpreted to imply a particular geometric shaped structure. For instance, trench sides may refer to different locations on a circular-shaped trench or discrete sides of a polygonal-shaped trench or even different locations on one discrete side of a polygonal-shaped trench. In a more general sense, trench 'surfaces' refers to all such trench sides as well as the base (bottom) of the trench.

Figure 6:
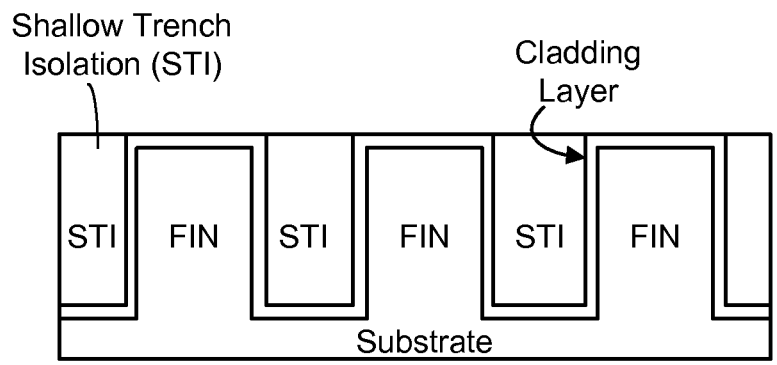

FIG. 6 demonstrates how the isolation oxide (or other suitable insulation material) is planarized using, for example, chemical mechanical planarization (CMP) or other suitable process capable of planarizing the structure. In the specific example embodiment shown, the planarization leaves at least a portion of the cladding layer. In this sense, the cladding layer can be used as an etch stop. In still other embodiments where hardmask material is left on top of the fins (for a double-gate configuration), a first layer of the hardmask (e.g., pad oxide) can be used as the etch stop, and which can also be used as a gate oxide if so desired. In still other such embodiments, the pad oxide can be completely removed, and a dummy oxide can be deposited before putting down the sacrificial gate material. In other embodiments, a high-k dielectric material can be deposited for the gate oxide at this time (or later in the process), as is sometimes done.

Figure 7:
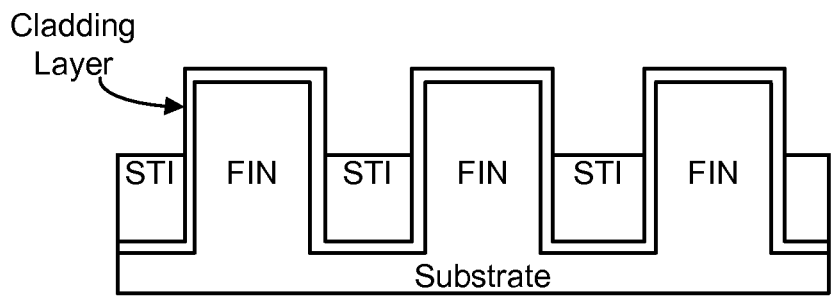

FIG. 7 demonstrates the resulting structure after the STI is recessed to below the top portion of the fin structures. Any suitable etch process (e.g., wet and/or dry etch) can be used to recess the STI. These recessed regions provide isolation for the source/drain regions of the transistor. The depth of the recess can vary from embodiment to embodiment, depending on factors such as desired gate size and height of overall fin. In some example embodiments, the STI recess depth is such that 35% to 85% of the overall fin height is exposed, although other embodiments may remove more or less of the STI material, depending on what is suitable for the intended application. In one specific example embodiment having a silicon substrate and a SiGe cladding layer and a silicon capping layer, the planarized and etched STI material is $SiO_2$. In another specific example embodiment having a silicon substrate and a germanium cladding layer and a silicon capping layer, the planarized and etched STI material is $SiO_2$ or germanium oxide ($GeO_2$). In another specific example embodiment having SiGe fins and a germanium cladding layer and a silicon capping layer, the planarized and etched STI material is $SiO_2$ or $GeO_2$. In another specific example embodiment having SiGe fins formed on a silicon substrate and a germanium cladding layer and a silicon capping layer, the planarized and etched STI material is $SiO_2$ or $GeO_2$. As will be appreciated, each of these example embodiments can also be made without the capping layer, or with another suitable capping material that may include silicon or not.

In some embodiments, the STI recess etching process may alter the thickness of the cladding layer that becomes exposed, such that the exposed portions of the cladding layer may be different (e.g., thinner) than the unexposed portions of the cladding layer. In some embodiments, the initial cladding layer thickness accounts for anticipated thinning due to subsequent processing. Further note that, in still other embodiments, the cladding layer may be provisioned with a non-uniform thickness, in effort to account for anticipated thinning in certain locations due to subsequent processing. Those, the initial thickness in those certain locations may be, for instance, thicker than the initial thickness in areas that will not be exposed to subsequent processing.

Partial Cladding Layer

FIGS. 8a-8d illustrate a portion of the method shown in FIGS. 1 through 7 and 9 through 12, in accordance with another embodiment of the present invention. As can be seen in this example case, the cladding layer is not provisioned onto the fins until after the STI recess, thereby effectively providing a partial cladding. Such a selective deposition process may be suitable, for example, when there is a desire to conserve cladding material and therefore reduce material expense and/or to decrease integration complexity.

Figure 3:
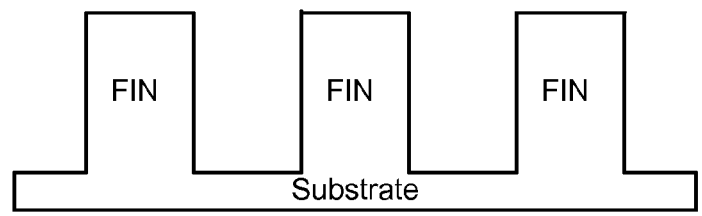
Figure 8A:
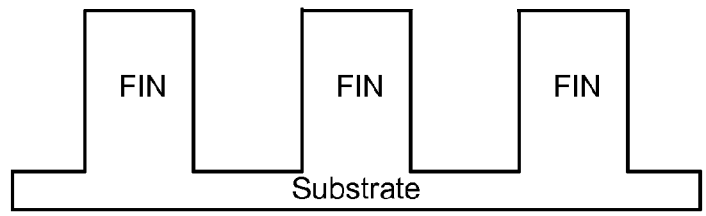
FIGS. 8a-8d illustrate a portion of the method shown in FIGS. 1 through 7 and 9 through 12, in accordance with another embodiment of the present invention.
Figure 8B:
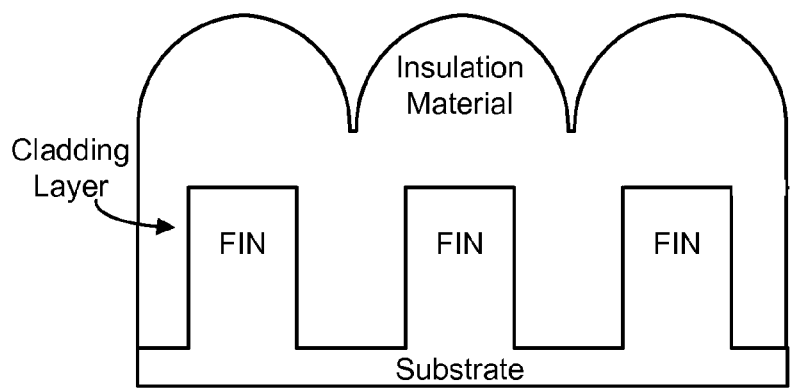
Figure 8C:
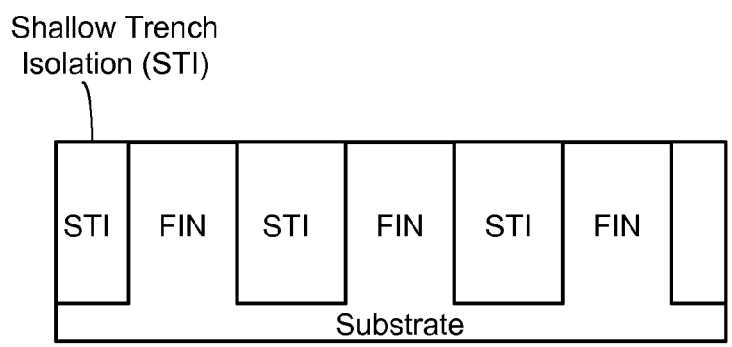
Figure 8D:
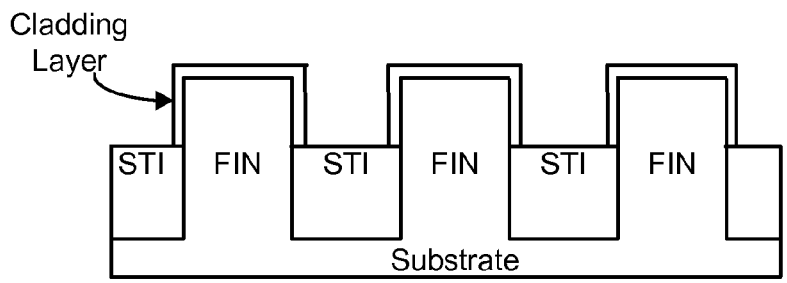

In this example embodiment, the fins are formed as shown in FIG. 8a, and the previous relevant description with reference to FIGS. 1 through 3 is equally applicable here. Then, rather than applying the cladding layer, the flow continues with filling the trenches with a suitable insulator material (as shown in FIG. 8b) and planarizing to remove any excess insulator material (as shown in FIG. 8c). To this end, the previous relevant description with reference to FIGS. 5 and 6 is equally applicable here. The process then continues with recessing the STI, as previously discussed with reference to FIG. 7 (as shown in FIG. 8d). Once the fins are exposed after the desired STI recess, the cladding layer can then be provisioned as further shown in FIG. 8d. The previous relevant description with reference to FIG. 4 is equally applicable here. As will be appreciated in light of this disclosure, an optional capping layer (e.g., silicon) may also be provisioned over the cladding layer as previously explained, if so desired.

The resulting structure can include any number of fins (one or more), isolated or otherwise surrounded by any suitable isolation material. As previously explained, the fins can be fabricated from the substrate material using photolithography. In other embodiments, the fins can be, for example, epitaxially grown such as described in U.S. Pat. No. 8,017, 463, titled, "Epitaxial Fabrication of Fins for FinFET Devices." In such cases, a fin is effectively formed as a layer in the manufacturing process. By forming a fin layer, fin thickness is determined through control of the process parameters used to form the fin layer rather than photolithographic processes. For instance, if the fin is grown with an epitaxial process, the fin's thickness will be determined by the growth dynamics of the epitaxy. FinFETs whose fin widths are determined through layer formation rather than photolithography may offer improved minimum feature sizes and packing densities. In other embodiments, the fins can be fabricated by removal of material by cutting or ablation, for example, using laser, or other suitable tools capable of fine-cutting semiconductor materials. Resulting fin geometries will generally vary depending on formation techniques employed.

Sacrificial Gate Stack

As previously explained, each of the views shown in FIGS. 9 through 12 is a cross-sectional side view taking across the channel region and parallel to the fins. This portion of the process effectively forms the gate stack using a remove metal gate (RMG) process, in accordance with some embodiments. The RMG process can be carried out in a conventional manner, in some such cases, or in custom or proprietary manner in still other cases. In general, and in accordance with some such embodiments, once the cladded fins are formed, a sacrificial gate material can be deposited on the cladded fins. In some cases, a sacrificial gate dielectric material may be deposited on the cladded fins, and then the sacrificial gate material is deposited on the sacrificial gate dielectric material. The deposited sacrificial gate material can then be planarized to remove any undesired topology and/or excess sacrificial gate material. A hardmask can then be provisioned and patterned on the sacrificial gate material layer, as typically done, followed by an etch process that results in the formation of sacrificial gate stacks such as the one generally shown in FIG. 9.

Figure 9:
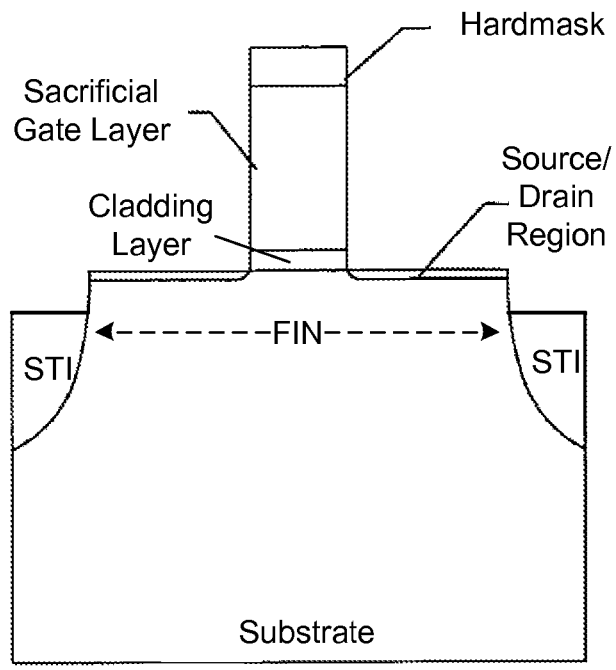

FIG. 9 illustrates patterning of the sacrificial gate material, in accordance with one specific example embodiment of the present invention. In some cases, this patterning can be carried out, for example, from a single depth of focus due to pre-patterning planarization of the sacrificial material layer, and using standard photolithography including deposition of hardmask materials (e.g., such as $SiO_2$, SiN, and/or other suitable hardmask materials) on the sacrificial gate material, patterning resist on a portion of the hardmask that will remain temporarily to protect the underlying gate region of the device, etching to remove the unmasked (no resist) portions of the hardmask (e.g., using a dry etch, or other suitable hardmask removal process), and then stripping the patterned resist, thereby leaving the patterned gate mask. In one specific example embodiment having a silicon substrate, the hardmask is implemented with SiN (e.g., 100 Å to 500 Å thick). Any number of suitable hardmask configurations can be used, as will be apparent in light of this disclosure.

Once the gate pattern hardmask is complete, etching can be carried out to remove the non-masked sacrificial gate material (and any remaining dummy gate dielectric material and/or pad oxide) down to the substrate and slightly into the substrate to form the source/drain regions, in accordance with some example embodiments. The etching can be accomplished with standard photolithography include, for example, dry etching or any suitable etch process or combination of etches. Note that the source/drain regions may be formed using the gate structure as a mask. In some embodiments, ion implantation may be used to dope the source/drain regions as conventionally done. The geometry of the resulting gate structure (e.g., width, depth, shape) as well as the shape and depth of source/drain regions, can vary from one embodiment to the next as will be appreciated, and the claimed invention is not intended to be limited to any particular device geometries.

This gate patterning can be used to simultaneously produce a plurality of such structures where, for example, all the transistors to be formed will be the same, or some transistors are one type/configuration (e.g., PMOS) and the remainder are another type/configuration (e.g., NMOS). The deposition of gate stack materials can be carried out, for example, using CVD or other suitable process. In one specific example embodiment, the substrate is a bulk silicon substrate, the recessed STI material is $SiO_2$, the fins are silicon (formed in the substrate), the cladding is SiGe, and the sacrificial gate material is polysilicon. Note, however, that the sacrificial gate material can be any suitable sacrificial material (e.g., polysilicon, silicon nitride, silicon carbide, etc). In some embodiments that include a sacrificial gate dielectric material, the sacrificial gate dielectric material can be, for instance, $SiO_2$ or any other suitable dummy gate insulator material.

Once the sacrificial gate stacks are formed, an RMG process and transistor formation can take place, as will now be described, in accordance with some example embodiments of the present invention.

RMG Process and Transistor Formation

FIGS. 9 through 12 further illustrate an RMG process flow and transistor formation, in accordance with an embodiment of the present invention. As can be seen, one transistor is shown, but any number of transistors can be formed using the same processes, as will be appreciated. In addition, the transistors formed may be implemented in a number of configurations (e.g., PMOS, NMOS, or both such as the case in complementary pair formation). In short, the techniques provided herein can be used with any type of transistor technology or configuration, and the claimed invention is not intended to be limited to any particular transistor type or configuration.

Figure 10:
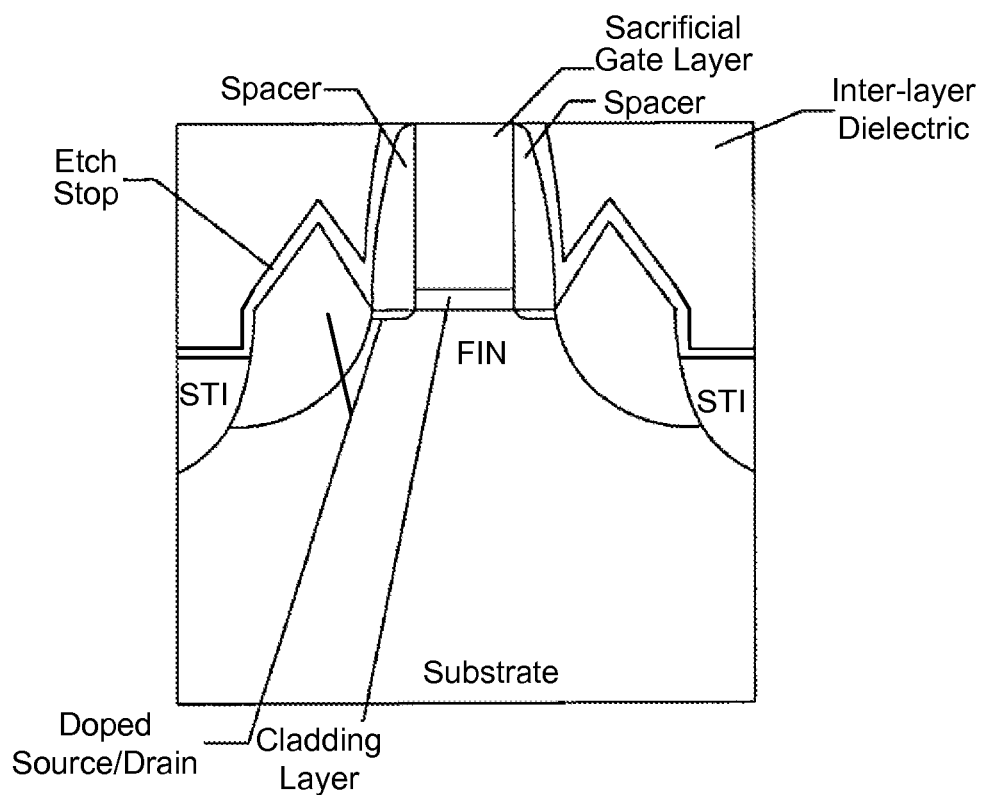

FIG. 10 illustrates a cross-sectional side view (perpendicular to the gates and parallel to the fins) of an example transistor structure formed with the patterned gate structure of FIG. 9, in accordance with one embodiment of the present invention. As can be seen, a spacer material is deposited and anisotropically etched to form sidewall spacers about the gate structure walls. The spacers may be, for example, a nitride that is deposited on the order of 50 Å to 500 Å thick, in some embodiments.

With respect to forming a P+ doped source/drain region for PMOS (as shown), a trench is etched into the substrate (e.g., by reactive ion etching). In this example configuration, the etching is constrained on one side by the previously formed STI neighboring each source/drain region and does not substantially isotropically undercut the gate structure on the other side. As such, an isotropic etch profile may be achieved on the inward edges of the trench, while leaving a small portion of the lightly doped source/drain region (under the spacer material, as shown). Then, an epitaxial source/drain can be grown which fills the trench and extends thereabove as indicated in FIG. 10. The trench may be filled, for example, using a growth of silicon germanium having 10-40 atomic percent germanium, in some embodiments. The source/drain doping may be done, for instance, by in-situ doping using a diborane source. The epitaxial source/drain only grows in the trench because all other material is masked or covered. The source/drain is raised and continues to grow until the facets meet. Note that if fabricating a complementary device having both PMOS and NMOS, the NMOS side can be covered by an oxide mask during PMOS doping region formation, in some embodiments. A source/drain implant may be used in some embodiments. Other embodiments may employ only NMOS source/drain formation, which may involve N+ doped regions which are not grown above the surface. Any number of suitable source/drain materials, as well as formation and doping techniques, can be used.

After source/drain formation and doping, an etch stop layer can be deposited (to protect doped source/drain regions during subsequent etching), if necessary. An inter-layer dielectric (ILD) is then deposited over the structure. The ILD can be, for example, any suitable low dielectric constant material such as an oxide (e.g., $SiO_2$), and the etch stop layer can be, for instance, a nitride (e.g., SiN). In some cases, the ILD may be doped with phosphorus, boron, or other materials and may be formed by high density plasma deposition. The ILD may then be planarized down to the upper surface of the sacrificial gate material, thereby removing the hardmask and the etch stop (if applicable) to open the gate, as shown in FIG. 10. As will be appreciated, the optional etch stop can be helpful in fabricating NMOS devices by acting as a tensile layer, but may degrade PMOS devices by producing undesired strain.

Figure 11:
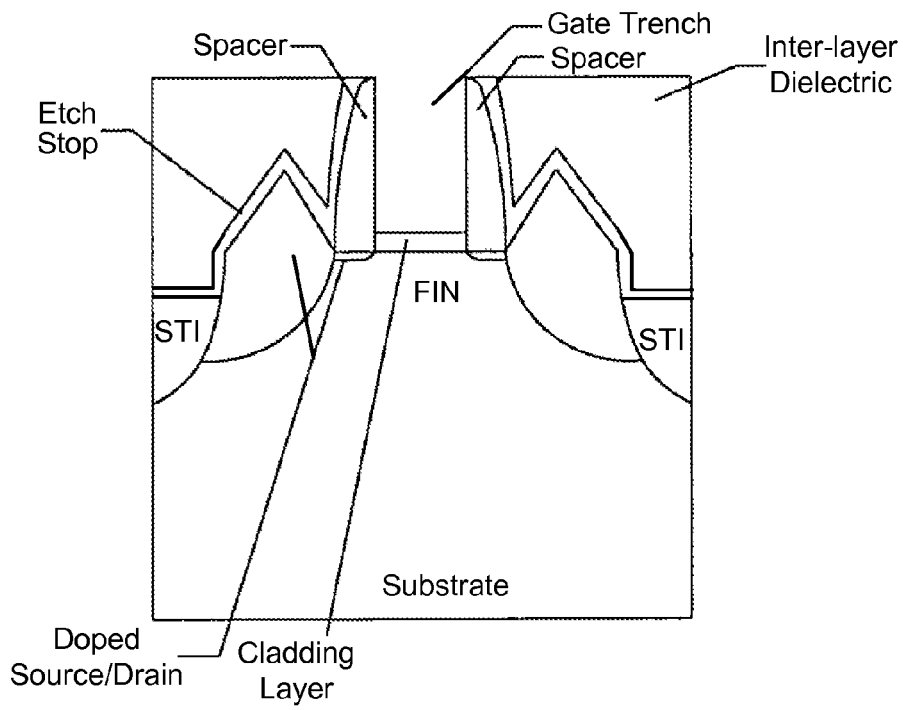

As shown in FIG. 11, the sacrificial gate material can be removed from between the spacers, thereby forming a gate trench over the previously provisioned cladding layer, in some embodiments (tri-gate configuration). In other embodiments, the sacrificial gate material can be removed from between the spacers, thereby forming a gate trench over the remaining pad oxide or other hardmask material left in place on the fin top (double-gate configuration). Removal of the sacrificial gate material may be done, for example, by any of a variety of suitable dry and/or wet etch techniques. In some applications having both PMOS and NMOS transistors, note that the sacrificial gate material for the NMOS and PMOS devices can be removed at the same time, or at different times using selective etching. Any number of suitable etch schemes can be used here as will be apparent.

Figure 12:
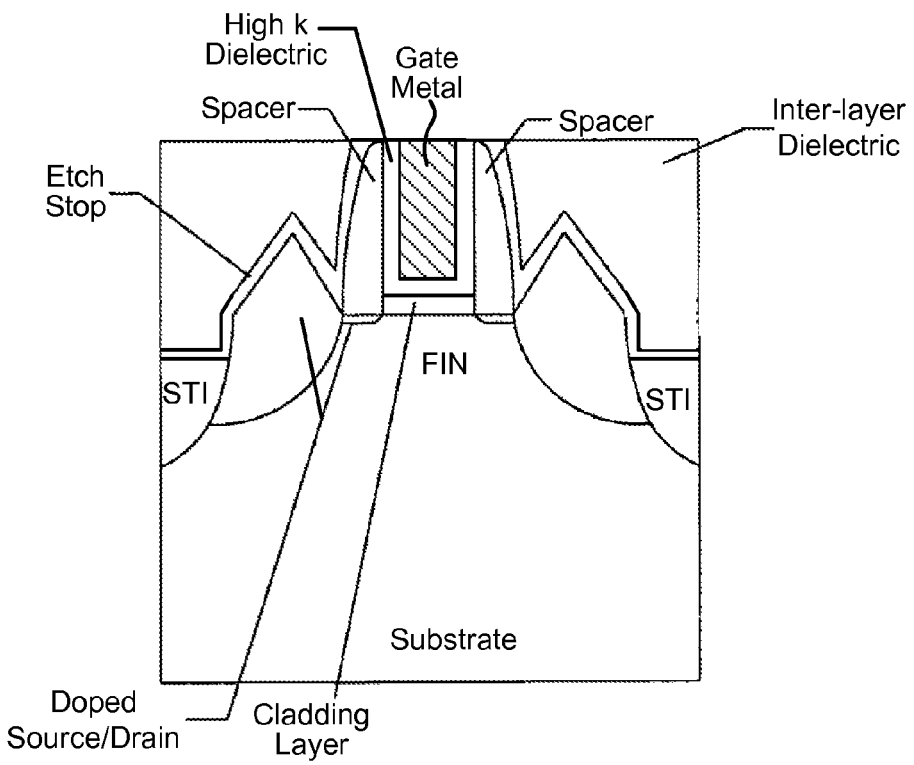
Figure 13A:
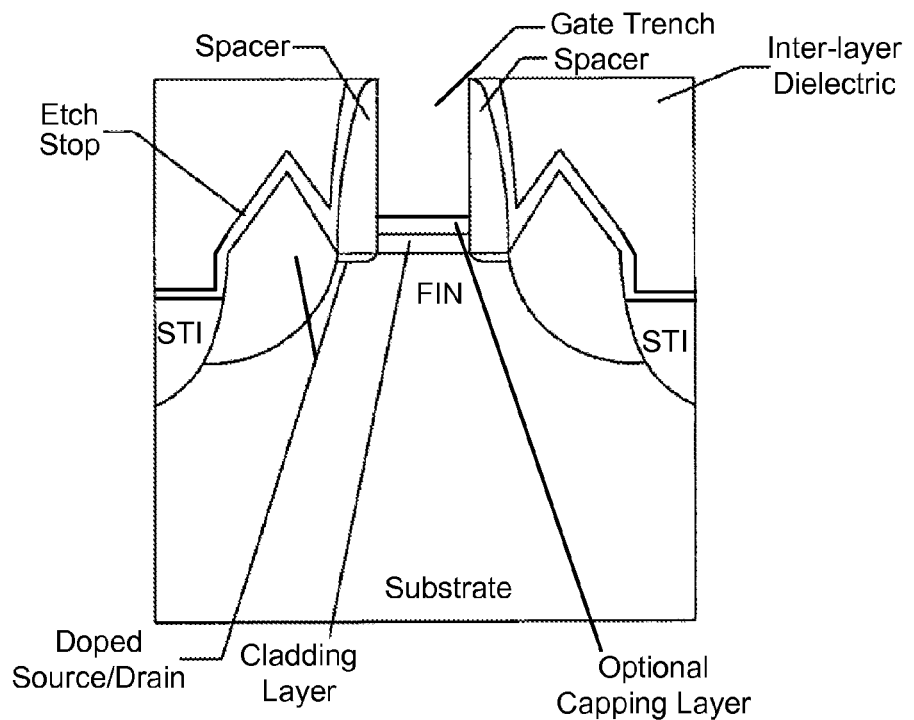
FIGS. 13a-13b illustrate a portion of the method shown in FIGS. 1 through 7 and 9 through 12, in accordance with another embodiment of the present invention.
Figure 13B:
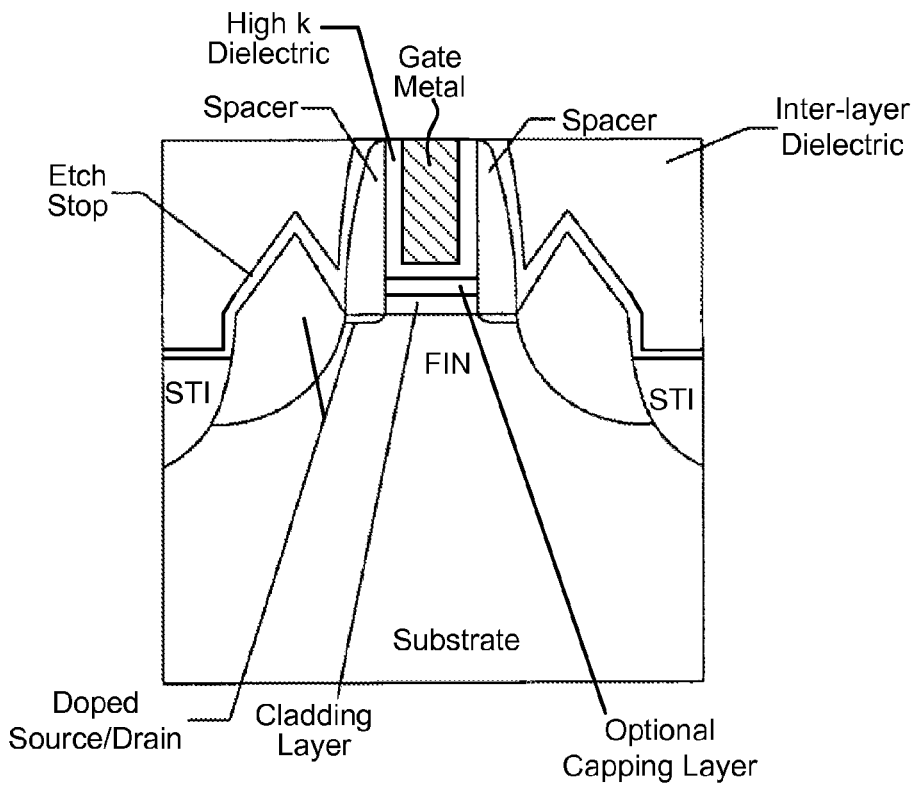

As shown in FIG. 12, a high-k gate dielectric layer and then gate metal are deposited (e.g., via CVD or other suitable process) directly on the cladding layer (or the optional capping layer if present as shown in FIGS. 13*a-b*) and exposed gate trench surfaces, and any excess gate metal may be planarized to form a metal gate electrode as shown. The gate metal can be, for example, titanium, platinum, cobalt, nickel, titanium nickel, palladium, or other suitable gate metal or combination of such metals. In double-gate configurations where some of the hardmask is left on top of the fin (such as a pad oxide), after removing the sacrificial gate material, that pad oxide or other hardmask material can also be removed. Then, a high-k gate dielectric can be deposited directly on the cladding layer (or the optional capping layer if present as shown in FIGS. 13*a-b*) and exposed gate trench surfaces, and planarized or otherwise shaped as desired. The high-k gate may comprise any suitable gate dielectric material (e.g., hafnium oxide, zirconium oxide, and aluminum oxide). Any number of suitable high-k gate dielectrics and treatments can be used, as is sometimes done, depending on factors such as desired isolation. Other embodiments may employ gate dielectrics that have a dielectric constant on par with $SiO_2$, or lower if so desired.

Cladding After Sacrificial Gate Stack Removal

Numerous variations on the techniques provided herein will be apparent. For instance, in another embodiment, the cladding layer can be added after the removal of the sacrificial gate stack material. In FIG. 11, for example, assume that the cladding layer is applied to the bottom of the gate trench after the removal process. In one such embodiment, the cladding layer can be a SiGe cladding layer formed on a silicon fin top after removal of a sacrificial polysilicon gate and gate oxide. In such cases, the strained SiGe cladding layer can be selectively grown on the exposed silicon fin areas in the gate trench. Again, in some such embodiments, the cladding layer can be capped with silicon, and then high-k/metal gate processing may continue as described herein or as otherwise desired. Note that both the SiGe cladding and silicon capping layer depositions could be either selective or non-selective.

Another variation on this option for adding the cladding layer after removal of the sacrificial gate stack material includes adding a fin recess etch to effectively thin the fin before adding the cladding film. Any suitable etch processes can be used to carry out this thinning (e.g., isotropic etch). Such an option would allow thin fin widths in the channel, and also allows additional surfaces of the fin to be cladded. The resulting thin cladded fin could again be capped as described herein. In one such example case have a silicon fin with SiGe cladding and a silicon capping layer, note that both the SiGe and silicon depositions can be either selective or non-selective.

Figure 14A:
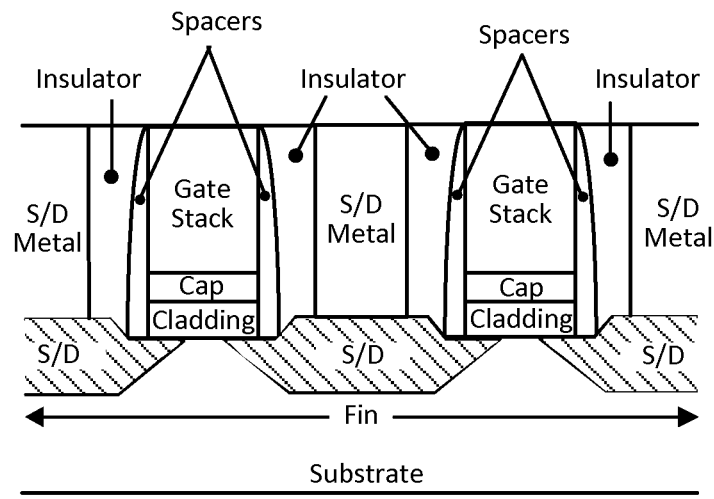
FIGS. 14a-14b each illustrates a resulting fin-based transistor structure, in accordance with other embodiments of the present invention.
Figure 14B:
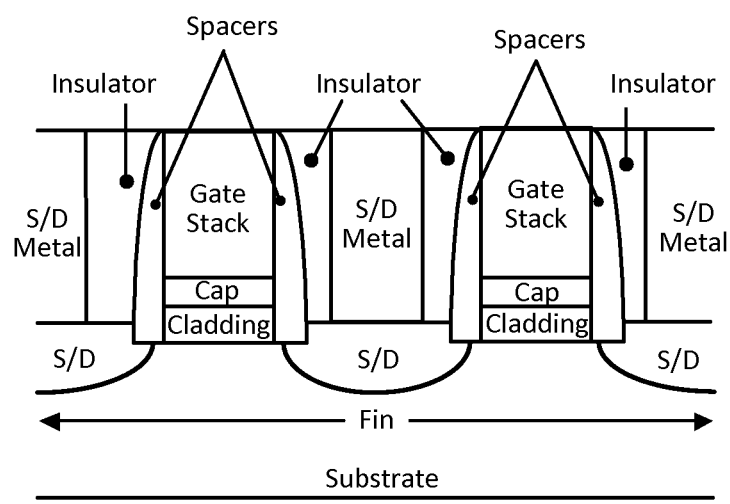

As can be further seen in the example embodiments shown in FIGS. 10-13*b*, an STI is provisioned and the source/drain regions have a raised faceted pointy shape. Other embodiments may not include such features, as will be appreciated. For example, FIGS. 14*a*-14*b* each illustrates a resulting fin-based transistor structure, in accordance with other embodiments of the present invention. The example embodiment shown in FIG. 14*a* includes source/drain regions that are raised and relatively flat, and include tip regions that undercut both the spacer and gate dielectric region, while the example embodiment shown in FIG. 14*b* includes source/drain regions that are relatively flush with fin top and that only undercut the spacer and region of the gate stack. Numerous variations and features may be integrated into the structure, depending on factors such as desired performance and fab capability. For further example, the width of the spacers can vary from one case to the next and in one specific example case are one-half the gate length, although any other suitable spacer width can be used as well. The source/drain (S/D) metal may be implemented, for example, with a contact metal (or series of metals) that can then be deposited and a subsequent reaction (annealing) can be carried out to form, for example, metal silicide and/or metal germanide source and drain contacts. As will be further appreciated, the contact may be implemented as a stack including one or more of a silicide/germanide layer, an adhesion layer, and/or a metal pad layer. Example contact metals include titanium, platinum, cobalt, nickel, titanium nickel, palladium, or any suitably conductive contact metal or alloys thereof. The insulator material can be, for instance, SiO2, but in other embodiments may be a low-k or high-k dielectric material that provides the desired insulation and may further provide structural integrity.

As will be further appreciated in light of this disclosure, any number of other transistor features may be implemented with an embodiment of the present invention. For instance, the source/drain regions may or may not include tip regions formed in the area between the corresponding source/drain region and the channel region. Likewise, the source/drain regions may be strained or not strained. In this sense, whether a transistor structure has strained or unstrained S/D regions, or S/D tip regions or no S/D tip regions, is not particularly relevant to various embodiments of the present invention, and such embodiments are not intended to be limited to any particular such structural features. Rather, any number of fin-based transistor structures and types can benefit from employing a SiGe or germanium cladding layer in the channel region as described herein. The example embodiments shown in FIGS. 14*a-b* each include the optional capping layer as well, but other such embodiments may not include the capping layer. Likewise, other such embodiments may include some transistors that have the channel cladding layer, and other transistors on the same die can be configured without the cladding layer.

Thus, FIGS. 1-14*b* illustrate various example transistor structures and fabrication processes, wherein a cladding material such as strained SiGe or germanium is provisioned on the channel area of a silicon or SiGe fin. The strained cladding may be, for example, on both sides and the top of the fin (such as in a tri-gate configuration) or only on the sides of the fin (such as in a double-gate configuration) or only on the top of the fin. Numerous variations and modifications will be apparent in light of this disclosure. The various layers and features may be implemented with any suitable dimensions and other desired layer parameters, using established semiconductor processes (e.g., CVD, MBE, photolithography, and/or other such suitable processes). In general, the specific layers and dimensions of the structure will depend on factors such as the desired device performance, fab capability, and semiconductor materials used. Specific device materials, features, and characteristics are provided for example only, and are not intended to limit the claimed invention, which may be used with any number of device configurations and material systems.

Simulation shows expected stress state in the fin and cladding layers and hole mobility due to that stress state. For instance, in one example embodiment, simulated stress for SiGe cladding on silicon fin structures was determined. In particular, for a SiGe cladding layer having 50% silicon and 50% germanium ($Si_{50}Ge_{50}$), a large compressive stress state occurs in the SiGe along the current flow (e.g., SiGe~−3.6 GPa and Si~0.65 GPa). In addition, a significant vertical stress occurs in the SiGe cladding (e.g., SiGe~−1.8 GPa and Si~1.8 GPa). In this example case, the stress state is in between uniaxial and biaxial on the sidewalls. In some cases, expected mobility response can be determined as a function of the germanium fraction in the cladding layers. For instance, the expected mobility is less than pure uniaxial stress but it is higher than biaxial stressed SiGe. For germanium percentages greater than about 30%, there is large expected hole mobility.

Note that the stress along the current flow direction and vertical vs gate length can vary from one embodiment to the next. For instance, for one embodiment assume a silicon fin is thinned at replacement metal gate location and then a strained SiGe cladding layer is provisioned. In another embodiment, assume a silicon fin is non-selectively cladded with SiGe (upfront in the process). The strain for the first embodiment (with the thinned fin) is not as high as for the second embodiment (with upfront cladding process), but still is sufficiently high and may make integration easier since a cladding layer such as germanium or SiGe is added later in the process flow.

Further note the additive nature of germanium or SiGe cladding in the channel area as described herein in addition to SiGe in the source/drain regions. For instance, assume a silicon fin is non-selectively cladded with $Si_{50}Ge_{50}$ film and further assume that the source/drain regions are also provisioned with $Si_{50}Ge_{50}$. As previously indicated, simulations indicate a large compressive stress state occurs in the SiGe cladding along the current flow (e.g., SiGe~−3.6 GPa) and a significant vertical stress occurs in the SiGe cladding (e.g., SiGe~−1.8 GPa). Addition of the SiGe source/drain regions further enhances the stress according to simulations, which indicate a larger compressive stress state occurs in the SiGe cladding along the current flow (e.g., SiGe~−4.9 GPa) and a vertical stress occurs in the SiGe cladding (e.g., SiGe~−2.6 GPa). The strain scheme may further change after removal of sacrificial gate stack materials. For instance, after polysilicon removal, simulations indicate a larger compressive stress state occurs in the SiGe cladding along the current flow (e.g., SiGe~−5.1 GPa) and a slight decrease in vertical stress occurs in the SiGe cladding (e.g., SiGe~−1.8 GPa).

Example System

Figure 15:
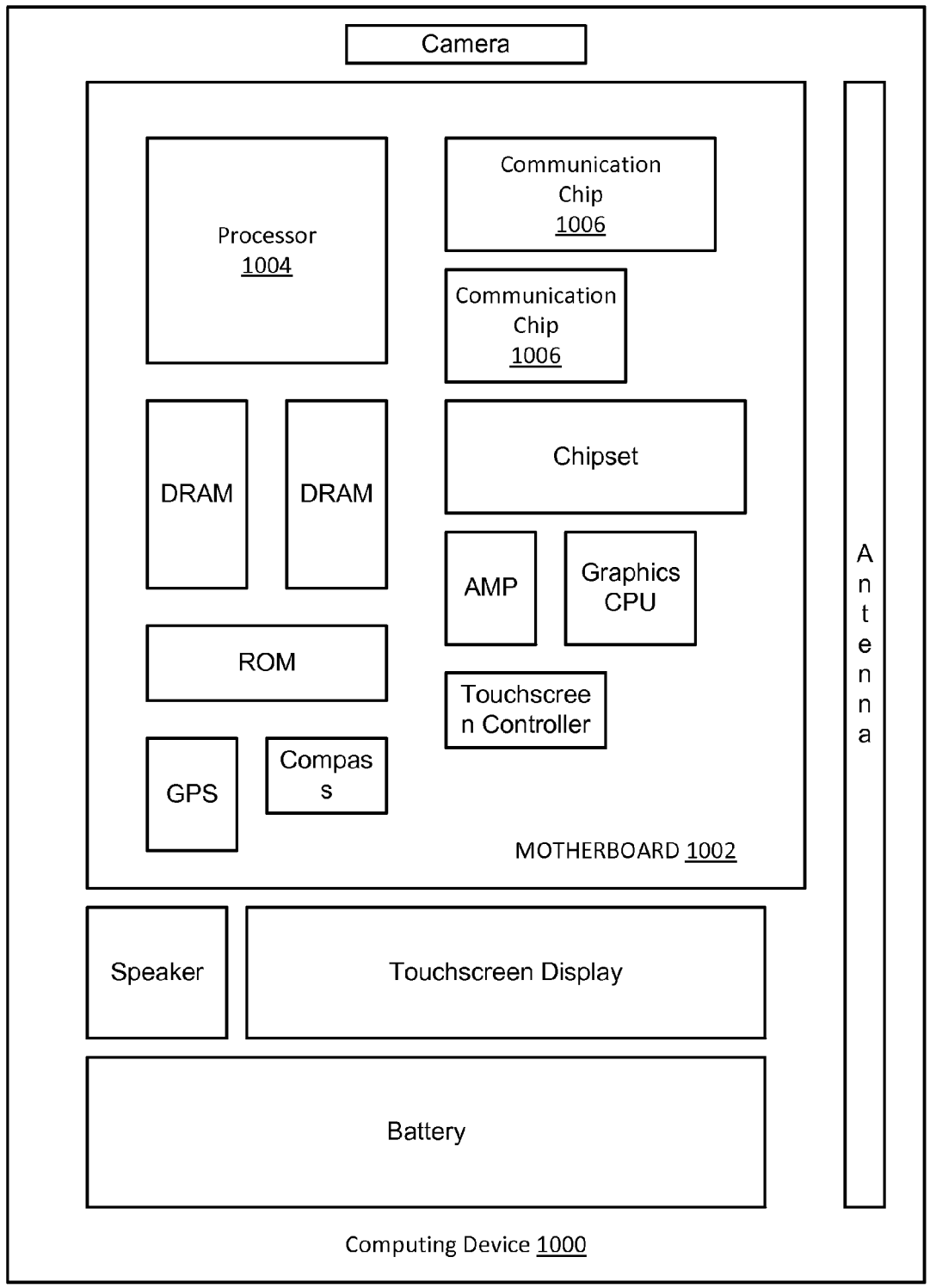
FIG. 15 illustrates a computing system implemented with one or more integrated circuit structures configured in accordance with an embodiment of the present invention.

FIG. 15 illustrates a computing system implemented with one or more integrated circuit structures configured in accordance with an embodiment of the present invention. As can be seen, the computing system 1000 houses a motherboard 1002. The motherboard 1002 may include a number of components, including but not limited to a processor 1004 and at least one communication chip 1006 (two are shown in this example), each of which can be physically and electrically coupled to the motherboard 1002, or otherwise integrated therein. As will be appreciated, the motherboard 1002 may be, for example, any printed circuit board, whether a main board or a daughterboard mounted on a main board or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures configured with transistors having cladded channels as described herein. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor 1004 includes one or more transistors having SiGe or germanium cladded channels as described herein. The term "processor" may refer to any device or portion of a device that processes, for instance, electronic data from registers and/or memory to transform that electronic data into other electronic data that may be stored in registers and/or memory.

The communication chip 1006 may also include an integrated circuit die packaged within the communication chip 1006. In accordance with some such example embodiments, the integrated circuit die of the communication chip 1006 includes one or more transistors having SiGe or germanium cladded channels as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs transistor devices having cladded channels as described herein (e.g., PMOS transistors configured with SiGe or germanium cladded channels). As will be appreciated in light of this disclosure, various embodiments of the present invention can be used to improve performance on products fabricated at any process node (e.g., in the micron range, or sub-micron and beyond) by allowing for the use of transistors having stress-enhanced channel and increase mobility.

Numerous embodiments will be apparent, and features described herein can be combined in any number of configurations. One example embodiment of the present invention provides a semiconductor device. The device includes a fin on a substrate, the fin comprising a semiconductor material and having channel region and corresponding source/drain regions adjacent thereto. The device further includes a cladding layer of germanium or silicon germanium (SiGe) on one or more surfaces of the channel region of the fin. The device further includes a gate dielectric layer over the cladding layer, and a gate electrode on the gate dielectric layer, and source/drain material in each of the source/drain regions. In some cases, the device further includes a capping layer between the cladding layer and the gate dielectric layer. In one such case, the capping layer is or otherwise comprises silicon. In some cases, the source/drain material is SiGe. In some cases, the fin is silicon or SiGe. In some cases, at least one of the cladding layer and the fin comprises 10% to 90% germanium. In some cases, the substrate comprises a first material and the fin comprises a second material different from the first material. In some cases, the substrate comprises a silicon layer and the fin is SiGe and the cladding layer is germanium. In some cases, the cladding layer covers side portions and a top portion of the fin. Numerous variations will be apparent. For instance, another embodiment provides a mobile computing device that includes the semiconductor device as variously defined in this paragraph.

Another embodiment of the present invention provides a semiconductor device. In this example case, the device includes a fin on a substrate, the fin comprising a semiconductor material and having channel region and corresponding source/drain regions adjacent thereto, wherein the fin is silicon or silicon germanium (SiGe). The device further includes a cladding layer of germanium or SiGe on one or more surfaces of the channel region of the fin. The device further includes a capping layer on the cladding layer, wherein the capping layer is or otherwise comprises silicon. The device further includes a gate dielectric layer on the capping layer, a gate electrode on the gate dielectric layer, and source/drain material in each of the source/drain regions, wherein the source/drain material is SiGe. In some cases, at least one of the cladding layer and the fin comprises 10% to 90% germanium. In some cases, the substrate comprises a first material and the fin comprises a second material different from the first material. In some cases, the substrate comprises a silicon layer and the fin is SiGe and the cladding layer is germanium. In some cases, the fin is silicon and the cladding layer is SiGe. In some cases, the cladding layer covers side portions and a top portion of the fin so as to provide a tri-gate transistor. Another embodiment provides a communication device comprising the semiconductor device as variously defined in this paragraph.

Another embodiment of the present invention provides a mobile computing system. The system includes a printed circuit board, a processor operatively coupled to the printed circuit board, a memory operatively coupled to the printed circuit board and in communication with the processor, and a wireless communication chip operatively coupled to the printed circuit board and in communication with the processor. At least one of the processor, wireless communication chip, and/or the memory comprises a semiconductor device. The semiconductor device includes a fin on a substrate, the fin comprising a semiconductor material and having channel region and corresponding source/drain regions adjacent thereto. The semiconductor device further includes a cladding layer of germanium or SiGe on one or more surfaces of the channel region of the fin. The semiconductor device further includes a gate dielectric layer over the cladding layer, a gate electrode on the gate dielectric layer, and source/drain material in each of the source/drain regions. In some cases, the semiconductor device further includes a capping layer between the cladding layer and the gate dielectric layer, wherein the capping layer is or otherwise comprises silicon. In some cases, the fin is silicon, the cladding layer is SiGe, and the source/drain material is SiGe. In one such case, the cladding layer SiGe is different from the source/drain material SiGe. In some cases, the substrate comprises a first material and the fin comprises a second material different from the first material. In some cases, the substrate comprises a silicon layer and the fin is SiGe and the cladding layer is germanium. In some cases, the cladding layer covers side portions and a top portion of the fin.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A semiconductor device, comprising:
   a fin on a substrate, the fin having a channel region and corresponding source/drain regions adjacent thereto;
   a cladding layer of germanium or silicon germanium (SiGe) on one or more surfaces of the channel region of the fin;
   a gate dielectric layer over the cladding layer;
   a gate electrode on the gate dielectric layer; and
   source/drain material in each of the source/drain regions, wherein the source/drain material is SiGe.

2. The semiconductor device of claim 1 further comprising a capping layer between the cladding layer and the gate dielectric layer.

3. The semiconductor device of claim 2 wherein the capping layer comprises silicon.

4. The semiconductor device of claim 1 wherein the cladding layer comprises 10% to 90% germanium.

5. The semiconductor device of claim 1 wherein the substrate comprises a first material and the fin comprises a second material different from the first material.

6. The semiconductor device of claim 1 wherein the substrate comprises a silicon layer and cladding layer is germanium.

7. The semiconductor device of claim 1 wherein the cladding layer covers side portions and a top portion of the fin.

8. A mobile computing device comprising the semiconductor device of claim 1.

9. A semiconductor device, comprising:
- a silicon fin on a substrate, the fin having a channel region and corresponding source/drain regions adjacent thereto;
- a cladding layer of germanium or SiGe on one or more surfaces of the channel region of the fin;
- a capping layer on the cladding layer, wherein the capping layer comprises silicon;
- a gate dielectric layer on the capping layer;
- a gate electrode on the gate dielectric layer; and
- source/drain material in each of the source/drain regions, wherein the source/drain material is SiGe.

10. The semiconductor device of claim 9 wherein the cladding layer comprises 10% to 90% germanium.

11. The semiconductor device of claim 9 wherein the substrate comprises a first material and the fin comprises a second material different from the first material.

12. The semiconductor device of claim 9 wherein the substrate comprises a silicon layer and the cladding layer is germanium.

13. The semiconductor device of claim 9 wherein the cladding layer is SiGe.

14. The semiconductor device of claim 9 wherein the cladding layer covers side portions and a top portion of the fin so as to provide a tri-gate transistor.

15. A communication device comprising the semiconductor device of claim 9.

16. A mobile computing system, comprising:
- a printed circuit board;
- a processor operatively coupled to the printed circuit board;
- a memory operatively coupled to the printed circuit board and in communication with the processor; and
- a wireless communication chip operatively coupled to the printed circuit board and in communication with the processor;
- wherein at least one of the processor, wireless communication chip, and/or the memory comprises a semiconductor device including:
  - a silicon fin on a substrate, the fin having a channel region and corresponding source/drain regions adjacent thereto;
  - a cladding layer of germanium or silicon germanium (SiGe) on one or more surfaces of the channel region of the fin;
  - a gate dielectric layer over the cladding layer;
  - a gate electrode on the gate dielectric layer; and
  - source/drain material in each of the source/drain regions, wherein the source/drain material is SiGe.

17. The system of claim 16 wherein the semiconductor device further includes a capping layer between the cladding layer and the gate dielectric layer, and the capping layer comprises silicon.

18. The system of claim 16 wherein the cladding layer is SiGe.

19. The system of claim 18 wherein the cladding layer SiGe is different from the source/drain SiGe.

20. The system of claim 16 wherein the substrate comprises a first material and the fin comprises a second material different from the first material.

21. The system of claim 16 wherein the substrate comprises a silicon layer and the cladding layer is germanium.

22. The system of claim 16 wherein the cladding layer covers side portions and a top portion of the fin.

* * * * *

UNITED STATES PATENT AND TRADEMARK OFFICE
CERTIFICATE OF CORRECTION

| | | |
|---|---|---|
| PATENT NO. | : 8,847,281 B2 | Page 1 of 1 |
| APPLICATION NO. | : 13/560474 | |
| DATED | : September 30, 2014 | |
| INVENTOR(S) | : Stephen M. Cea et al. | |

It is certified that error appears in the above-identified patent and that said Letters Patent is hereby corrected as shown below:

In the Claims

In column 14, line 52, Claim 1, line 2, please delete "a fin" and insert -- a silicon fin --

Signed and Sealed this
Twenty-seventh Day of January, 2015

Michelle K. Lee
*Deputy Director of the United States Patent and Trademark Office*